United States Patent
Sugiura

(10) Patent No.: US 8,482,337 B2
(45) Date of Patent: Jul. 9, 2013

(54) HIGH FREQUENCY SEMICONDUCTOR SWITCH

(75) Inventor: Tsuyoshi Sugiura, Yokohama (JP)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 13/355,257

(22) Filed: Jan. 20, 2012

(65) Prior Publication Data

US 2012/0154018 A1    Jun. 21, 2012

(51) Int. Cl.
*H03K 17/687* (2006.01)

(52) U.S. Cl.
USPC ............ 327/434; 327/436; 327/566; 333/103

(58) Field of Classification Search
USPC ............................ 327/434, 436, 566; 333/103
See application file for complete search history.

(56) References Cited

U.S. PATENT DOCUMENTS

| | | | | |
|---|---|---|---|---|
| 5,548,239 | A * | 8/1996 | Kohama | 327/408 |
| 5,774,792 | A * | 6/1998 | Tanaka et al. | 455/78 |
| 8,244,199 | B2 * | 8/2012 | Goto et al. | 455/333 |
| 2009/0181630 | A1 | 7/2009 | Seshita et al. | |

FOREIGN PATENT DOCUMENTS

JP    2009-194891    8/2009

\* cited by examiner

*Primary Examiner* — Kenneth B. Wells
(74) *Attorney, Agent, or Firm* — McDermott Will & Emery LLP

(57) ABSTRACT

There is provided a high frequency semiconductor switch having an FET designed in consideration of characteristics required for a transmission terminal and a reception terminal. The high frequency semiconductor switch includes a plurality of field effect transistors that each include a source region and a drain region formed on a substrate to be spaced apart by a predetermined distance, a gate formed on the substrate to be disposed at the predetermined distance, a source contact formed on the substrate to be connected with the source region, and a drain contact formed on the substrate to be connected with the drain region. A distance between a source contact and a drain contact of a reception terminal side transistor is longer than a distance between a source contact and a drain contact of a transmission terminal side transistor.

1 Claim, 3 Drawing Sheets

HIGH FREQUENCY SEMICONDUCTOR SWITCH

BACKGROUND OF THE INVENTION

1. Field of the Invention

The present invention relates to a high frequency semiconductor switch, and more particularly, to a high frequency semiconductor switch used in wireless communications apparatuses.

2. Description of the Related Art

A front end of wireless communications apparatuses such as mobile phones, PCs, and the like, has had a high frequency semiconductor switch mounted therein. The high frequency semiconductor switch includes a plurality of field effect transistors (FETs). A FET is used for each terminal, for example, a transmission terminal and a reception terminal in a time division multiple communications mode and a transmission terminal and a reception terminal in a frequency division multiple communications mode, or the like, (for example, see Patent Document 1: Japanese Patent Laid-Open Publication No. 2009-194891).

The FETs used for each terminal are generally designed to have the same configuration. Therefore, there is little difference between the terminals in terms of characteristics thereof.

The FETs used for each terminal are designed to have the same configuration, but to have a difference in terms of the characteristics required between the terminals. For example, characteristics required for the transmission terminal and the reception terminal may be different.

SUMMARY OF THE INVENTION

An aspect of the present invention provides a high frequency semiconductor switch having FETs designed in consideration of characteristics required for a transmission terminal and a reception terminal.

According to an aspect of the present invention, there is provided a high frequency semiconductor switch having a plurality of field effect transistors able to implement wireless communications by switching an application of voltage to a gate of each field effect transistor, the high frequency semiconductor switch being characterized in that, the plurality of field effect transistors each include a source region and a drain region formed on a substrate to be spaced apart by a predetermined distance, a gate formed on the substrate so as to be disposed at the predetermined distance, a source contact formed on the substrate so as to be connected with the source region, and a drain contact formed on the substrate so as to be connected with the drain region, and among the plurality of field effect transistors, a distance between a source contact and a drain contact of a reception terminal side transistor connected with a reception terminal side is longer than a distance between a source contact and a drain contact of a transmission terminal side transistor connected with a transmission terminal side.

According to the high frequency semiconductor switch, at the transmission side having a relatively short distance, on resistance may be relatively small. Therefore, relatively high insertion loss characteristics required at the transmission side may be obtained. Meanwhile, at the reception side having a relatively long distance, a distance between the gate and the contact may be relatively long and crosstalk therebetween may be relatively small. Therefore, relatively high isolation characteristics required at the reception side may be obtained.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Figure 1:
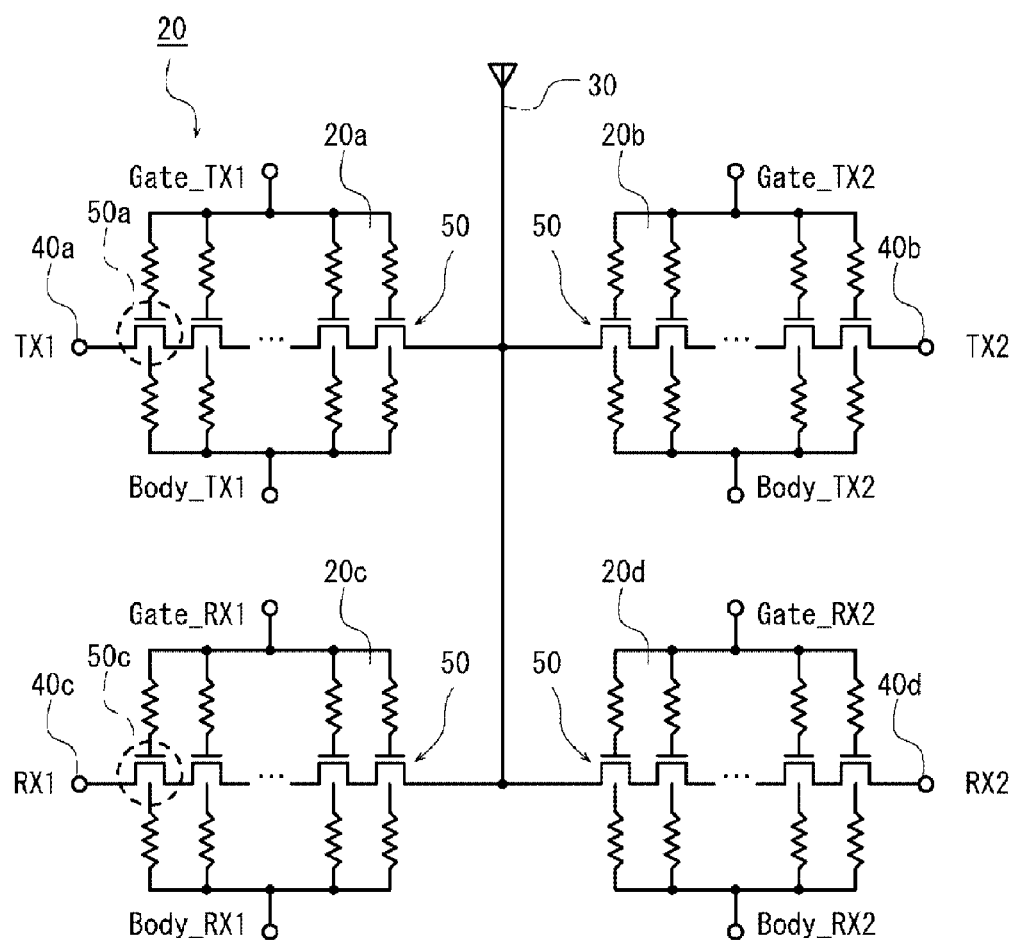
FIG. 1 is a diagram showing an example of a schematic circuit configuration of a high frequency semiconductor switch according to an embodiment of the present invention.

Hereinafter, embodiments of the present invention will be described in detail with reference to the accompanying drawings. In explaining the drawings, like reference numerals will denote like elements throughout the specification and the overlapped explanation thereof will be omitted. Further, dimension rates of the drawings may be exaggerated for convenience so that they may be different from actual rates thereof. In addition, expressions "formed on ~" may include a case in which any element is formed indirectly formed thereon through other object as well as a case in which any element is formed directly formed thereon.

FIG. 1 is a diagram showing an example of a schematic circuit configuration of a high frequency semiconductor switch according to an embodiment of the present invention.

As shown in FIG. 1, a high frequency semiconductor switch 10 may include four series switches 20a to 20d. The series switches 20a to 20d may be disposed between an antenna terminal 30 and RF terminals 40a to 40d. The series switches 20a to 20d may include at least one field effect transistor 50 (hereinafter, referred to as 'FET'). As shown in FIG. 1, gates of a plurality of FETs 50 included in the same series switches 20a to 20d may simultaneously receive voltage applied thereto. Therefore, conduction between the antenna terminal 30 and the RF terminals 40a to 40d may be controlled by switching an application of voltage to the gates for each series switch, 20a to 20d. Alternatively, a body of the FET may also have voltage applied thereto.

In an example shown in FIG. 1, in the RF terminals 40a to 40d, the RF terminals 40a and 40b may be transmission terminals Tx and the RF terminals 40c and 40d may be reception terminals Rx. The transmission and reception terminals maybe, for example, a terminal having different frequencies for a frequency division multiple communications mode or a terminal to be switched every time for a time division multiple communications mode.

For example, as the series switch 20a is turned-on and the other series switches 20c and 20d are turned-off, a frequency of 900 MHz maybe transmitted, and as the series switch 20c is turned-on and other series switches 20a, 20b, and 20d are turned-off, a frequency of 900 MHz may be received. The number of series switches 20 and RF terminals 40 may be appropriately increased or reduced according to transmitting and receiving modes or necessary diversity.

Figure 2A:
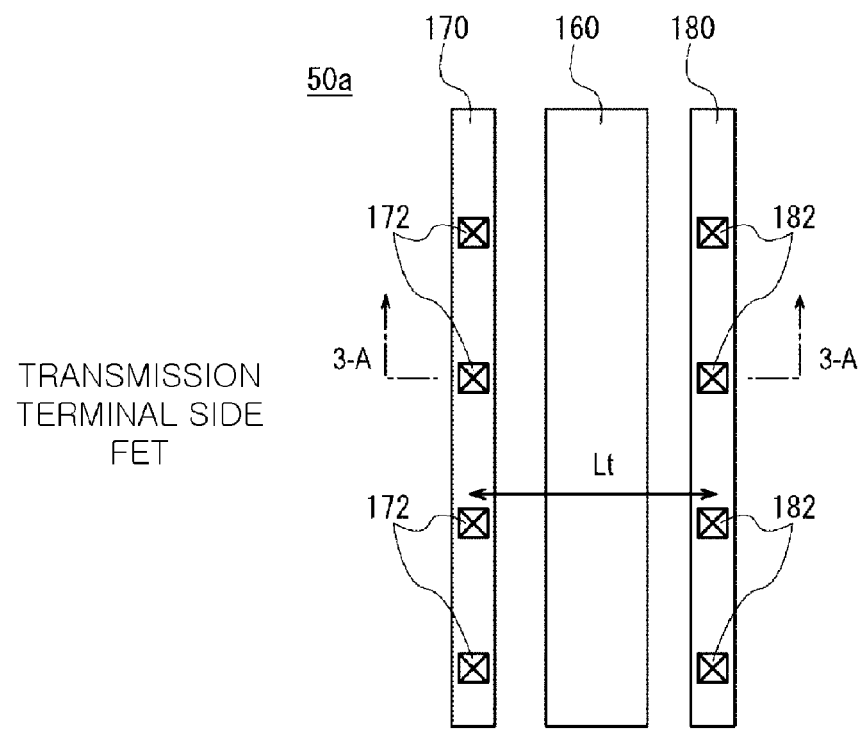
FIG. 2 is a schematic plan view showing a wiring of an FET included in a switch according to the embodiment of the present invention.
Figure 2B:
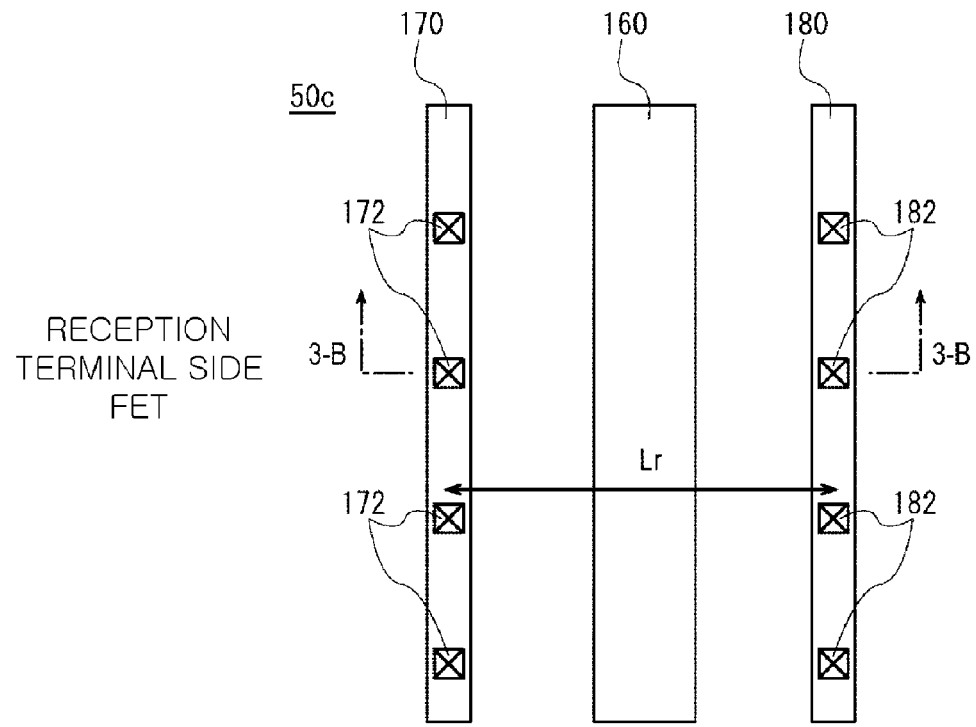
Figure 3A:
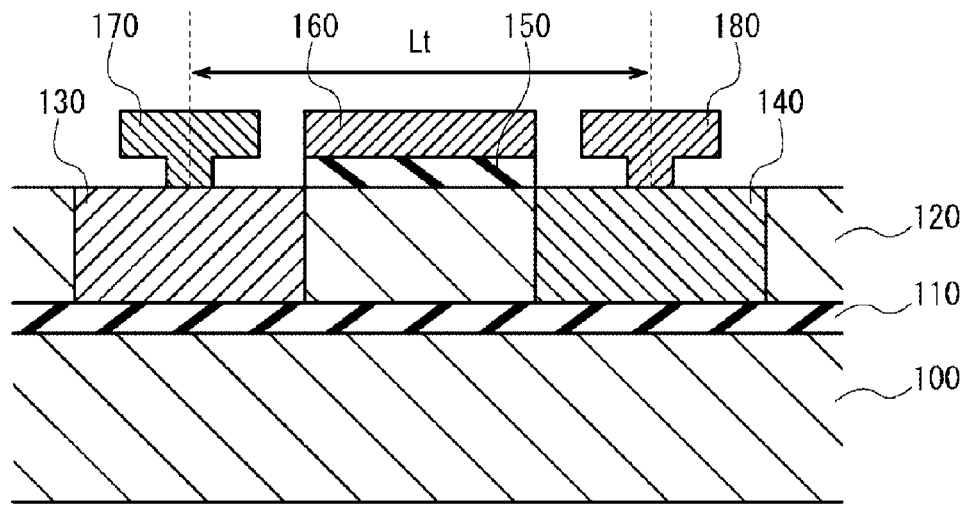
FIG. 3 is a schematic cross-sectional view of the FET taken along line 3-A and 3-B of FIG. 2.

FIG. 2 is a schematic plan view showing a wiring of an FET included in a switch according to the embodiment of the present invention. FIG. 2A shows the wiring of the FET of the transmission terminal side switch and FIG. 2B shows the wiring of the FET of the reception terminal side switch. FIG. 3 is a schematic cross-sectional view of the FET taken along line 3-A and 3-B of FIG. 2. FIG. 3A is a cross-sectional view of the FET of the transmission terminal side switch and FIG. 3B is a cross-sectional view of the FET of the reception terminal side switch.

Figure 3B:
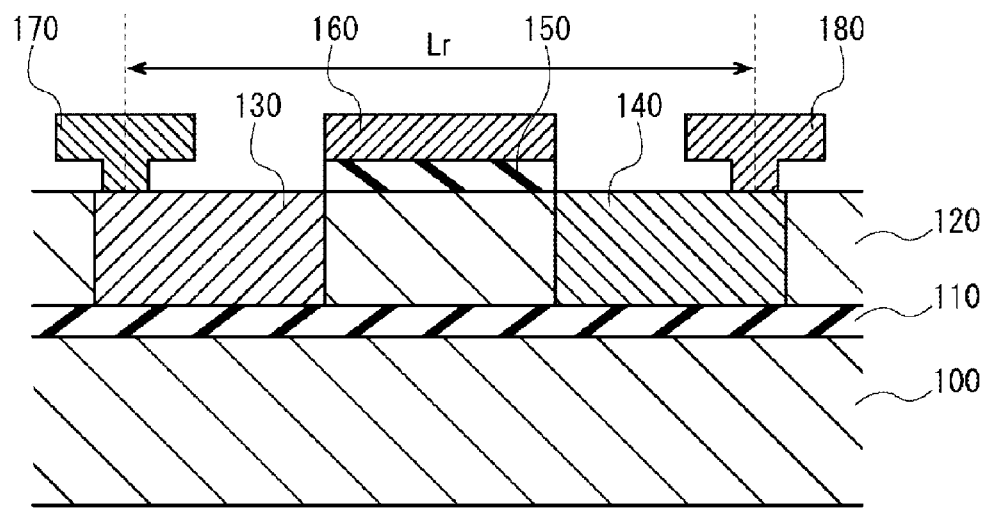

FIGS. 2A and 3A show, for example, an FET 50a surrounded by a dotted line in the series switch 20a of FIG. 1 and FIGS. 2B and 3B show, for example, an FET 50c surrounded by a dotted line in the series switch 20c of FIG. 1.

As shown in FIGS. 2 and 3, any one of FETs 50a and 50c may be formed on a silicon on insulator (SOI) substrate. A silicon oxide insulating film 110 may be formed on any conductive (for example, a P type) silicon substrate 100. A semiconductor layer 120 on the insulating film 110 maybe formed with conductive (for example, an N type) source region 130 and drain region 140 different from the substrate. The gate 160 may be formed on the semiconductor region (body) between the source region 130 and the drain region 140, having an oxide film 150 interposed therebetween.

A source wiring 170 may be formed on the source region 130. The source region 130 and the source wiring 170 may be electrically connected to each other through a source contact 172. A drain wiring 180 may be formed on the drain region 140. The drain region 140 and the drain wiring 180 may be electrically connected to each other through a drain contact 182.

FIGS. 2A and 2B are compared with FIGS. 3A and 3B. The width of the gate 160 is the same. However, an interval Lt between the source contact 172 and the drain contact 182 of the transmission terminal side FET 50a shown in FIGS. 2 (A) and 3 (A) may be shorter than an interval Lr between the source contact 172 and the drain contact 182 of the reception terminal side FET 50c shown in FIGS. 2(B) and 3(B).

In the transmission terminal side FET 50a having a short interval Lt, since the path of current is relatively short, the internal resistance (on-resistance) of the FET may be relatively small when signal (current) is applied. The voltage resistance is relatively small due to the on resistance, and therefore, the insertion loss may be relatively small. Meanwhile, in the reception terminal side FET 50c having the long interval Lr, the path of current may be relatively long, and therefore, the insertion loss may be increased, but the distance between the gate 160 and the source contact 172 or the drain contact 182 may be relatively long. Since the contacts 172 and 182 are spaced apart from the gate 160, crosstalk may be relatively reduced therebetween such that isolation characteristics are increased.

Since a high power signal is applied to the transmission terminal, the relatively small insertion loss (insertion loss characteristics) may be required. On the other hand, since a relatively low power signal is applied to the reception terminal, the insertion loss characteristics needs to be set appropriately and the isolation characteristics are required. As described above, in consideration of the above requirements, the distance between the source contact 172 and the drain contact 182 of the transmission terminal side FET 50a and the reception terminal side FET 50c may be controlled. That is, in consideration of a trade off relation of the insertion loss characteristics and the isolation characteristics for the distance between the source contact 172 and the drain contact 182, at the transmission terminal side FET 50a, the distance Lt needs to be relatively short, and at the reception terminal side FET 50c, the distance Lr needs to be relatively long. Therefore, relatively high insertion loss characteristics may be obtained at the transmission terminal side FET 50a, and relatively high isolation characteristics may be obtained at the reception terminal side FET 50c.

The embodiment of the present invention describes the case in which a total of four RF terminals including two transmission terminals and two reception terminals are used. However, the number of transmission terminals and reception terminals are not limited to the above embodiment of the present invention. The embodiment of the present invention may be applied to different terminals.

As shown in FIG. 2, the source contact 172 and the drain contact 182 are disposed in a stepping stone manner. However, they are not limited to the above-mentioned manner. The contact lengthily extending along the source wiring 170 or the drain wiring 180 may be formed.

As set forth above, according to the embodiments of the present invention, the high frequency semiconductor switch having the FETs matching the characteristics required for the transmission terminal and the reception terminal may be implemented.

While the present invention has been shown and described in connection with the above-described embodiments, it will be apparent to those in the art that modifications and variations can be made without departing from the spirit and scope of the invention as defined by the appended claims.

What is claimed is:

1. A high frequency semiconductor switch having a plurality of field effect transistors able to implement wireless communications by switching an application of voltage to a gate of each field effect transistor, the high frequency semiconductor switch characterized in that, the plurality of field effect transistors each include a source region and a drain region formed on a substrate to be spaced apart by a predetermined distance, a gate formed on the substrate so as to be disposed at the predetermined distance, a source contact formed on the substrate so as to be connected with the source region, and a drain contact formed on the substrate so as to be connected with the drain region, and among the plurality of field effect transistors, a distance between a source contact and a drain contact of a reception terminal side transistor connected with a reception terminal side is longer than a distance between a source contact and a drain contact of a transmission terminal side transistor connected with a transmission terminal side.

* * * * *